(12) United States Patent
Lin

(10) Patent No.: US 8,633,641 B2
(45) Date of Patent: Jan. 21, 2014

(54) SIDE ILLUMINATION LENS FOR LED

(75) Inventor: Ming-Te Lin, New Taipei (TW)

(73) Assignee: Uniled Lighting Taiwan Inc., New Taipei (TW)

( * ) Notice: Subject to any disclaimer, the term of this patent is extended or adjusted under 35 U.S.C. 154(b) by 197 days.

(21) Appl. No.: 13/280,800

(22) Filed: Oct. 25, 2011

(65) Prior Publication Data

US 2013/0100679 A1 Apr. 25, 2013

(51) Int. Cl.
*F21V 7/09* (2006.01)
*F21V 5/00* (2006.01)
*F21V 13/04* (2006.01)

(52) U.S. Cl.
USPC .............................. 313/327; 362/335; 362/337

(58) Field of Classification Search
USPC ......... 362/327, 328, 331, 333, 337, 335, 346; 385/146
See application file for complete search history.

(56) References Cited

U.S. PATENT DOCUMENTS

| 6,674,096 B2 * | 1/2004 | Sommers ......................... 257/98 |
| 7,254,309 B1 * | 8/2007 | Chou et al. ..................... 385/146 |
| 7,438,444 B2 * | 10/2008 | Pao et al. ....................... 362/327 |
| 7,540,635 B2 * | 6/2009 | Kim et al. ...................... 362/327 |
| 7,659,552 B2 * | 2/2010 | Chang ............................ 257/98 |
| 7,837,370 B2 * | 11/2010 | Bierhuizen et al. ........... 362/555 |
| 8,434,914 B2 * | 5/2013 | Li et al. ......................... 362/335 |

* cited by examiner

*Primary Examiner* — Karabi Guharay
(74) *Attorney, Agent, or Firm* — Lowe Hauptman & Ham, LLP

(57) ABSTRACT

A side illumination lens for a LED is disclosed. One of the embodiments includes a bottom cavity, an incident surface, four total internal reflective surfaces, and a side refractive surface. Light beam emitted by the LED enters the lens through the incident surface. A first portion of the light beam is reflected by the total internal reflection surfaces to the refractive surface and emits out of the lens. The second portion of light beam enters the lens and exits from the refractive surface. A second one of the embodiments is to roughen the side refractive surface for diffusing the exit light beams so that a broader area can be illuminated softly.

4 Claims, 9 Drawing Sheets

US 7,254,309

SIDE ILLUMINATION LENS FOR LED

BACKGROUND

1. Technical Field

The present invention relates to a lens, especially for modifying light beam of a LED configured on a bottom recess of the lens.

2. Description of Related Art

FIG. 1 is a prior art.

U.S. Pat. No. 7,254,309 discloses a lens for a LED, the light emitted from the LED chip 40 enters the lens 20 through the incident surface 22. A portion of the light is reflected by the reflective surface 23 to the second refractive surface 32 in an internal total reflection manner, and then the light is refracted by the second refractive surface 32 and emits out of the second refractive surface 32 of the lens 20 along a lateral direction of the lens 20, such as a first optical path P1 of the lens 20. The other portion of the light enters the lens 20 through the incident surface 22 and then directly emits out of the lens 20 to toward the lateral directions of the lens 20 respectively to be refracted by the first refractive surface 31 along a second optical path P2 and the third refractive surface 33 along a third optical path P3. The first optical path P1, the second optical path P2 and the third optical path P3 are in a direction substantially normal to the central optic axis C of the lens 20. Hence the light emitted from the LED chip 40 is directed towards a lateral direction of the lens 20.

After the light emitted from the LED chip 40 enters the lens 20, the intensity distribution of energy of the emitted light can be divided in a zone 1, a zone 2 and a zone 3. The zone 1 is located between the central optic axis C and the connection line of the first cross point c1 to the second cross point c2. The zone 2 is located between the connection line of the first cross point c1 to the fourth cross point c4 and the zone 1 (the third cross point c3 is located on the connection line of the first cross point c1 to the fourth cross point c4). The zone 3 is located between the zone 2 and the bottom surface 21. The energy distribution is strongest in the zone 1, then sub-strong in the zone 2, and weakest in the zone 3.

DETAILED DESCRIPTION OF THE INVENTION

Total internal Reflection (TIR) is an optical phenomenon that occurs when a light beam strikes a medium boundary at an angle larger than the Critical Angle with respect to the normal to the surface. If the Refractive Index is lower on the other side of the boundary no light can pass through, so effectively all of the light is reflected. The critical angle is the Angle of Incidence above which the total internal reflection occurs.

When a light beam crosses a boundary between materials with different refractive indices, the light beam will be partially refracted at the boundary surface according to the Snell's Law, and partially reflected. The Snell's law gives the relationship between angles of incidence and refraction for a wave impinging on an interface between two media with different indices $n_1$, $n_2$ of refraction:

$$n_1 \sin \Theta_1 = n_2 \sin \Theta_2$$

where $\Theta_1$ and $\Theta_2$ are the angles from the normal of the incident and refracted waves, respectively.

However, if the angle of incidence is greater (i.e. the ray is closer to being parallel to the boundary) than the critical angle—the angle of incidence at which light is refracted such that it travels along the boundary, where the $\Theta_2$ equals 90 degree, then the light will stop crossing the boundary altogether and instead totally reflect back internally.

Figure 1:
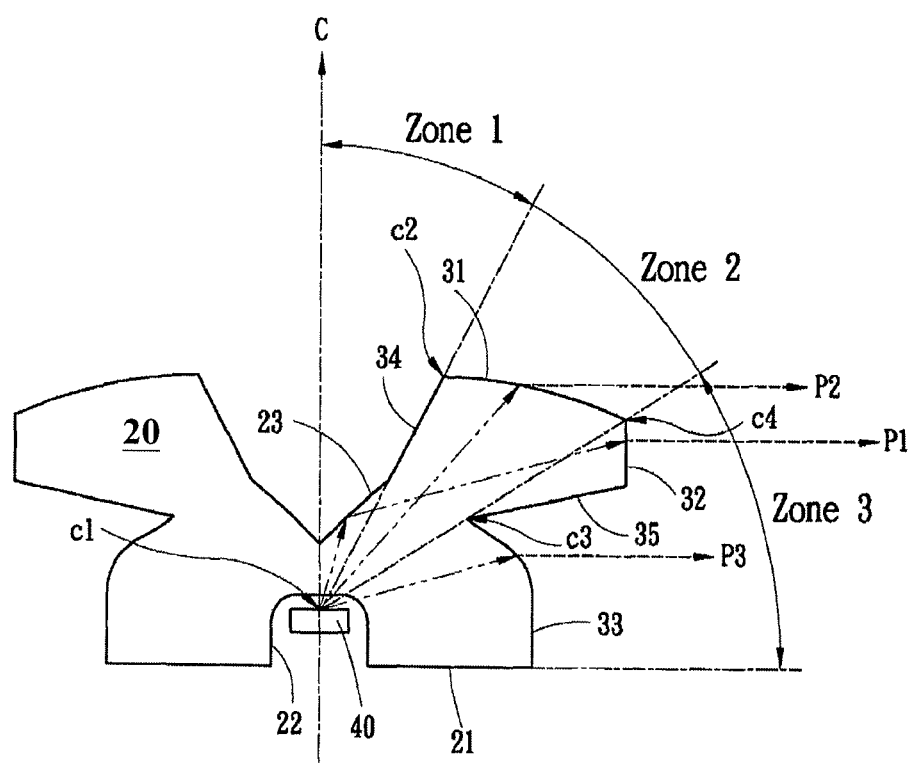
FIG. 1 is a prior art.
Figure 2:
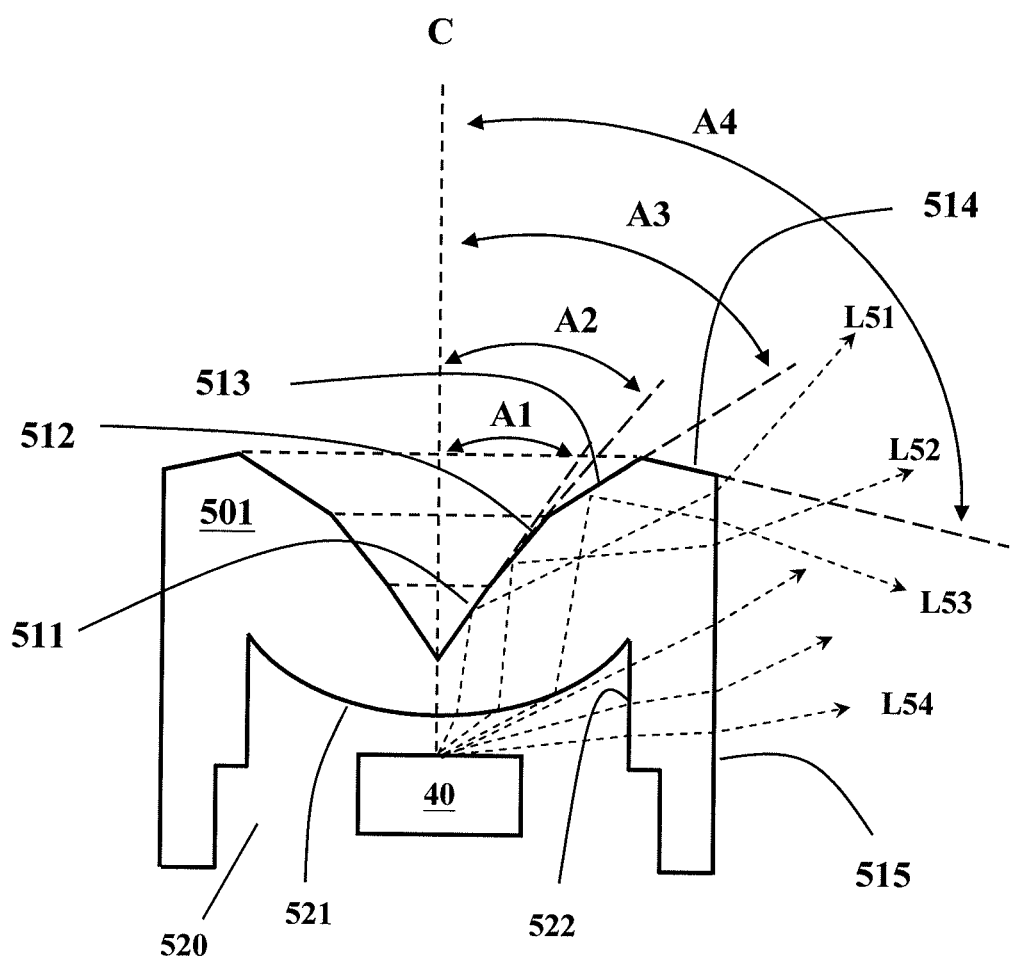
FIGS. 2-3 are a first lens according to the present invention.
Figure 3:
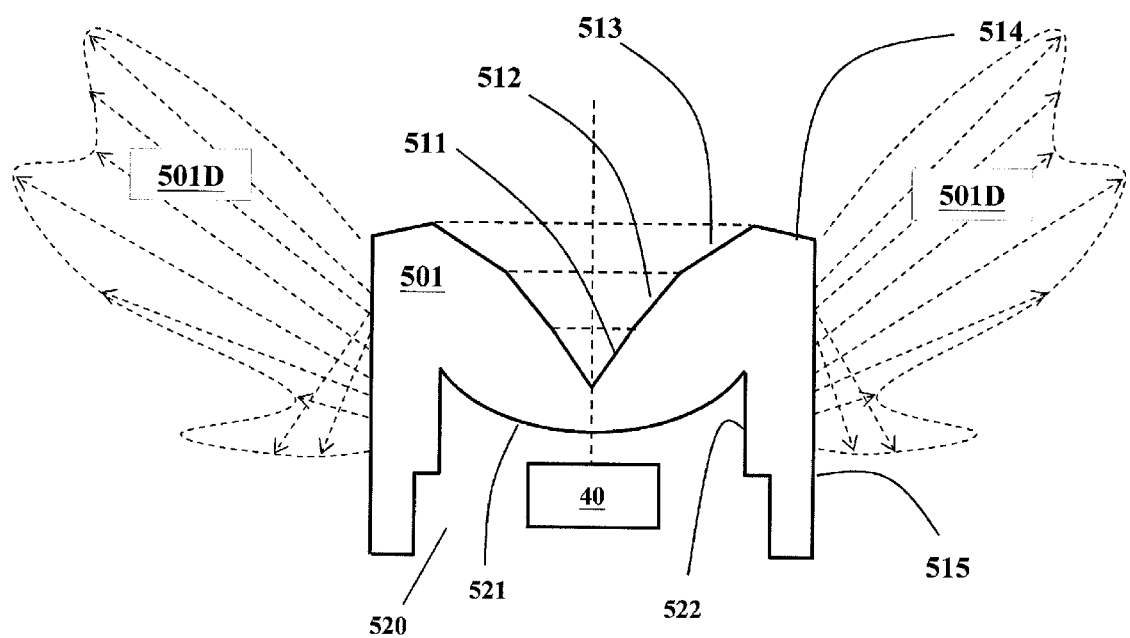

FIGS. 2-3 are a first lens according to the present invention.

FIG. 2 shows a section view of the first lens 501. Lens 501 has four total internal reflection surfaces. A first total internal reflection surface 511 is configured in a first angle A1 with respect to a longitudinal axis C of the lens 501. A second total internal reflection surface 512 is neighbored to the first total internal reflection surface 511 and configured in a second angle A2 larger than the first angle A1 with respect to the longitudinal axis C of the lens 501. A third total internal reflection surface 513 is neighbored to the second total internal reflection surface 512 and configured in a third angle A3 larger than the second angle A2 with respect to the longitudinal axis C of the lens 501. A fourth total internal reflection surface 514 is neighbored to the third total internal reflection surface 513 and configured in a fourth angle A4 larger than the third angle A3 with respect to the longitudinal axis C of the lens 501.

Further, FIG. 2 shows that an exiting surface 515 is a flat surface, neighbored to the fourth total internal reflection surface 514.

A bottom recess 520 is configured on the bottom of the lens 501. A LED 40 is configured in the recess 520. A top incident surface 521 is configured on a top of the recess 520, and a side incident surface 522 encloses the recess 520. A first portion of the light beams L51, L52, L53 of the LED 40 enters the top incident surface 521 and then reflected by one of the total internal reflection surface 511, 512, 513, 514 and exits from the exiting surface 515. A second portion of the light beams L54 of the LED 40 enters the side incident surface 522 to be refracted and then exits from the exiting surface 515. FIG. 2 shows that the top incident surface 521 is made a convex surface against the recess 520 in this embodiment.

FIG. 3 shows a section view of an illumination intensity profile of the lens of FIG. 2. The illumination intensity profile 501D is mainly projected to the right top and left top of the lens 501 in the section view, however the illumination intensity profile 501D is of a bowl-shaped profile in a three dimensional configuration.

Figure 4:
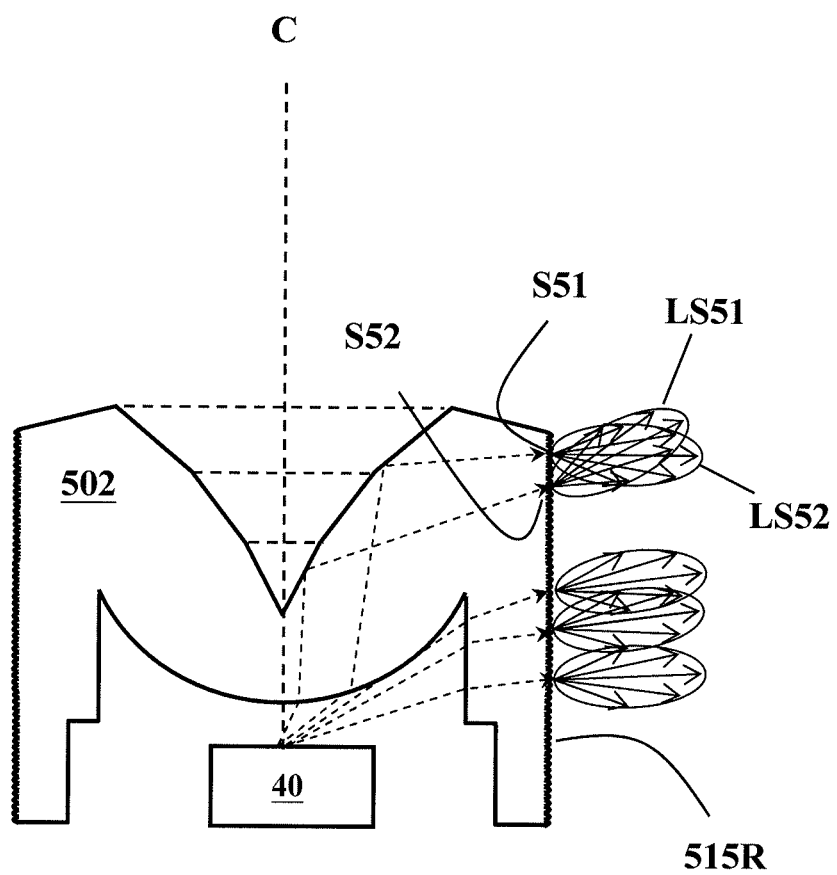
FIGS. 4-5 are a second lens according to the present invention.
Figure 5:
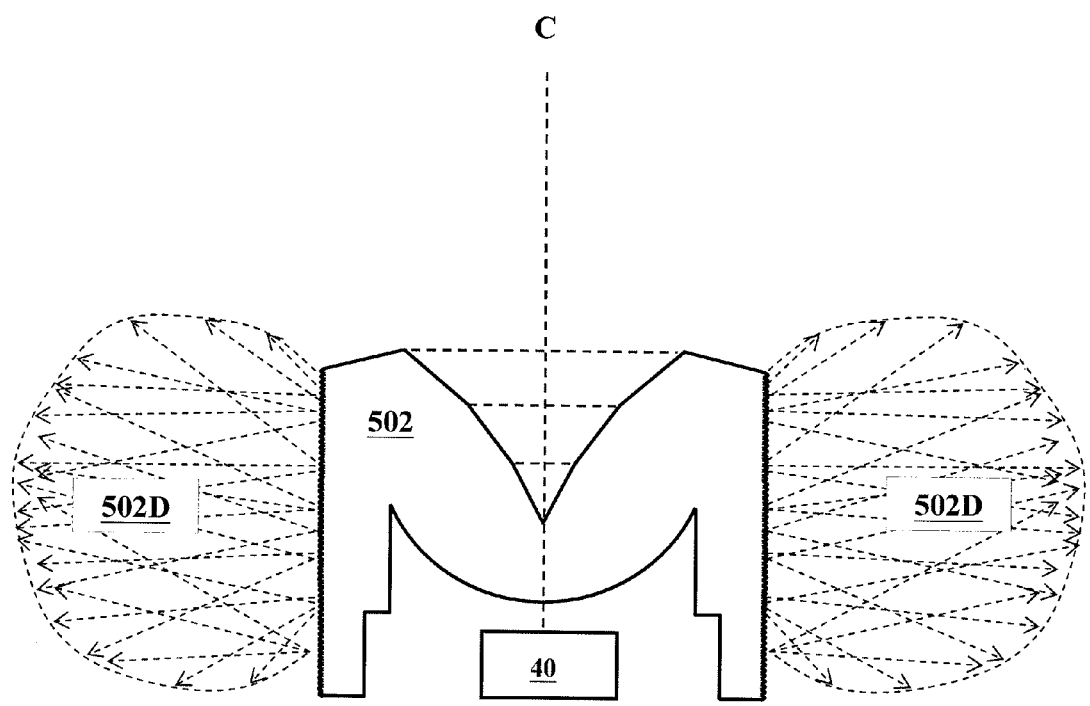

FIGS. 4-5 are a second lens according to the present invention.

FIG. 4 shows a section view of the second lens according to the present invention. The key feature of this embodiment is that the exiting surface 515R is roughened to a certain status so that each and all exiting light beam is firstly diffused and then emitted softly and broadly. FIG. 4 shows diffused beam intensity profile LS51, LS52 existed from a spot S51, S52. The LS51 shows a light intensity distribution of the light beam exits from the spot S51. The LS52 shows a light intensity distribution of the light beam exits from the spot S52. The light intensity distribution LS51, LS52 is softer as compared with the light intensity of L51, L52 of FIG. 2 respectively. The light intensity L51, L52 in FIG. 2 is a single light beam or a very narrow bunch of light beam.

FIG. 5 shows a section view of an illumination intensity profile of the lens of FIG. 4. The light beam is projected softly, evenly, and broadly to the right side and left side of the lens 502 in the section view, however the illumination intensity profile 502D is of a donut-shaped profile in a three dimensional configuration.

Figure 6:
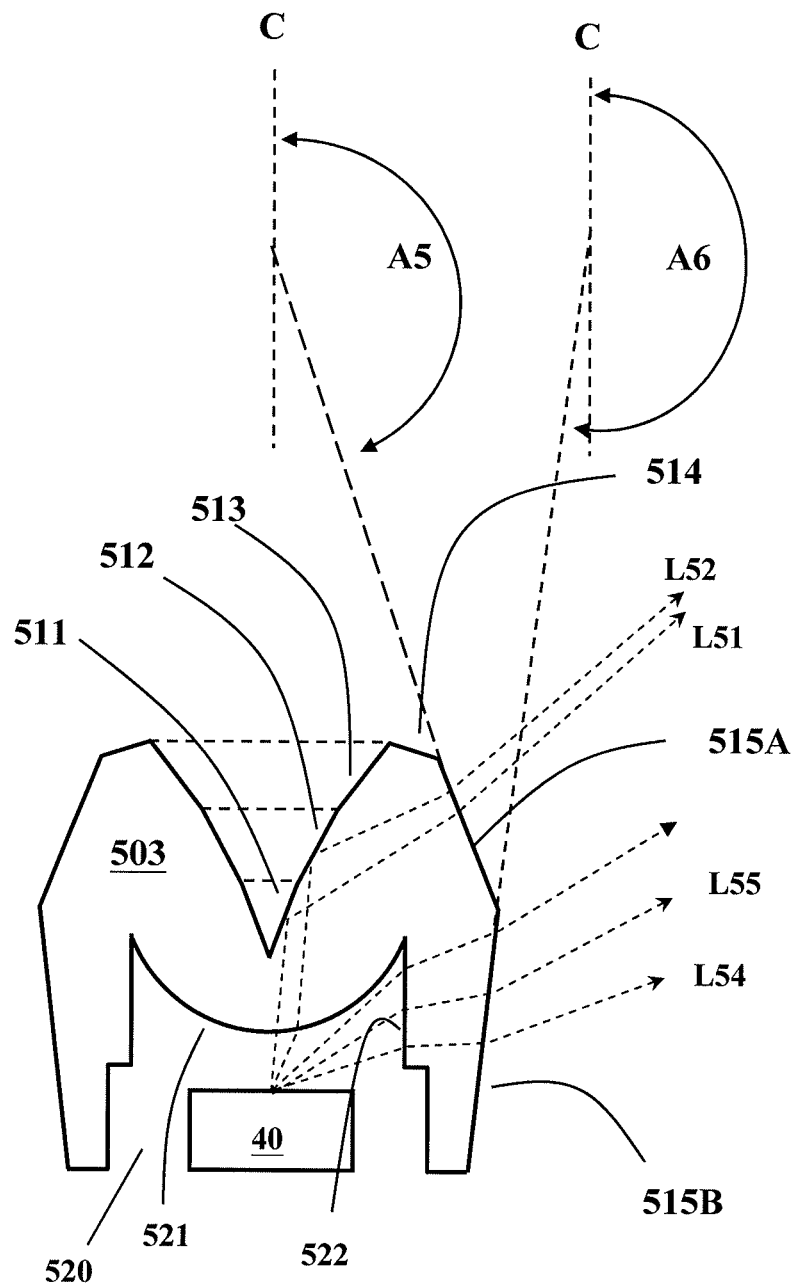
FIGS. 6-7 are a third lens according to the present invention.
Figure 7:
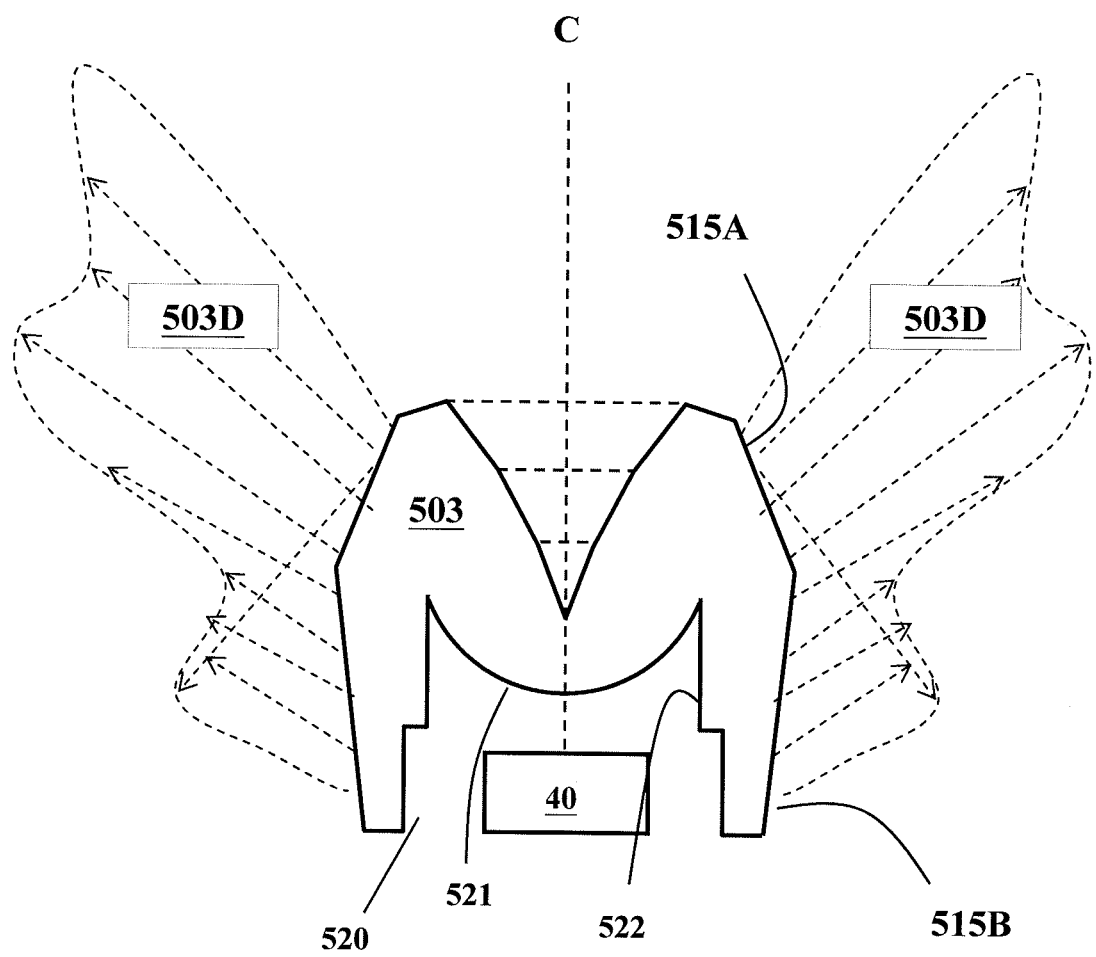

FIGS. 6-7 are a third lens according to the present invention.

FIG. 6 shows a section view of the third lens. As compared to the one shown in FIG. 3 the key feature of FIG. 6 is that the exiting surface is a bent surface 515A, 515B. The lens 503 has four total internal reflection surfaces 511~514 similar to the one shown in FIG. 2.

FIG. 6 shows a section view of the lens 503. Lens 503 has a first total internal reflection surface 511, configured in a first angle A1 with respect to a longitudinal axis C of the lens 503. A second total internal reflection surface 512 is neighbored to the first total internal reflection surface 511 and configured in a second angle A2 larger than the first angle A1 with respect to the longitudinal axis C of the lens 503. A third total internal reflection surface 513 is neighbored to the second total internal reflection surface 512 and configured in a third angle A3 larger than the second angle A2 with respect to the longitudinal axis C of the lens 503. A fourth total internal reflection surface 514 is neighbored to the third total internal reflection surface 513 and configured in a fourth angle A4 larger than the third angle A3 with respect to the longitudinal axis C of the lens 503.

A first exiting surface 515A is neighbored to the fourth total internal reflection surface 514 and configured in a fifth angle A5 larger than the fourth angle A4 with respect to the longitudinal axis C of the lens 503. A second exiting surface 515B is neighbored to the first exiting surface 515A and configured in a sixth angle A6 larger than the fifth angle A5 with respect to the longitudinal axis C of the lens 503.

A bottom recess 520 is configured on the bottom of the lens 503, a LED 40 is configured in the recess 520. A top incident surface 521 is configured on a top of the recess 520, and a side incident surface 522 encloses the recess 520. A first portion of the light beams L51, L52 of the LED 40 enters the top incident surface 521 and then reflected by one of the total internal reflection surface 511, 512, 513, 514 and exits from the exiting surface 515A. A second portion of the light beams L54, L55 of the LED 40 enters the side incident surface 522 to be refracted and then exits from the exiting surface 515B. The top incident surface 521 is made a convex surface in this embodiment.

FIG. 7 shows a section view of an illumination intensity profile of the lens of FIG. 6. The illumination intensity profile 503D is mainly projected to the right top and left top of the lens 503 in the section view, however the illumination intensity profile 503D is with a relative stronger light intensity on top portion and a relative lower light intensity on bottom portion.

Figure 8:
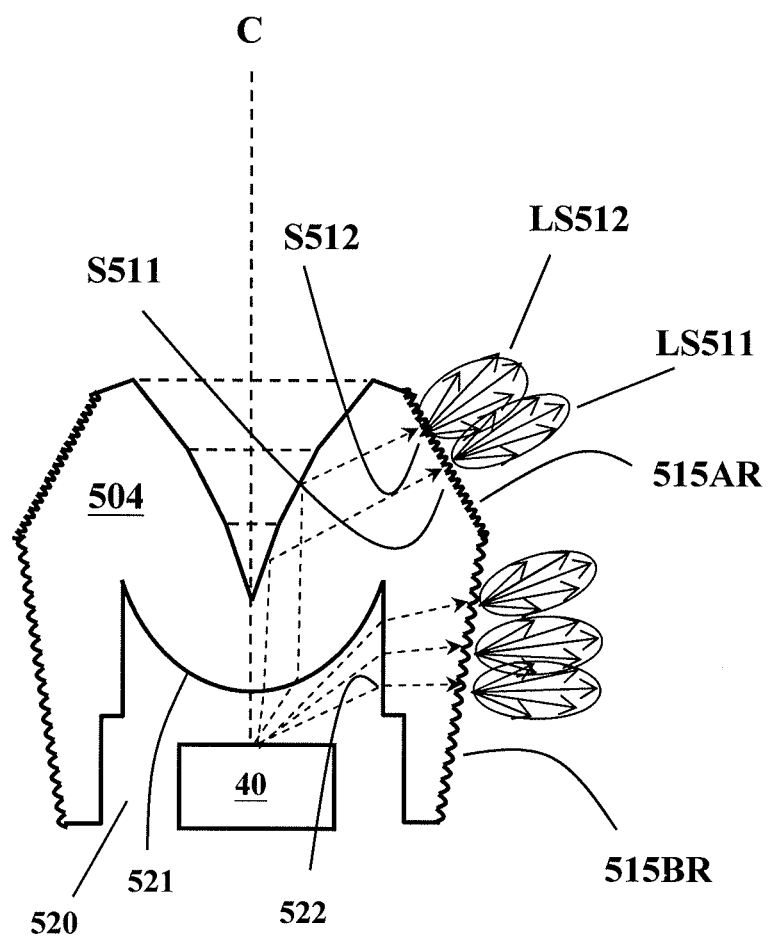
FIGS. 8-9 are a fourth lens according to the present invention.
Figure 9:
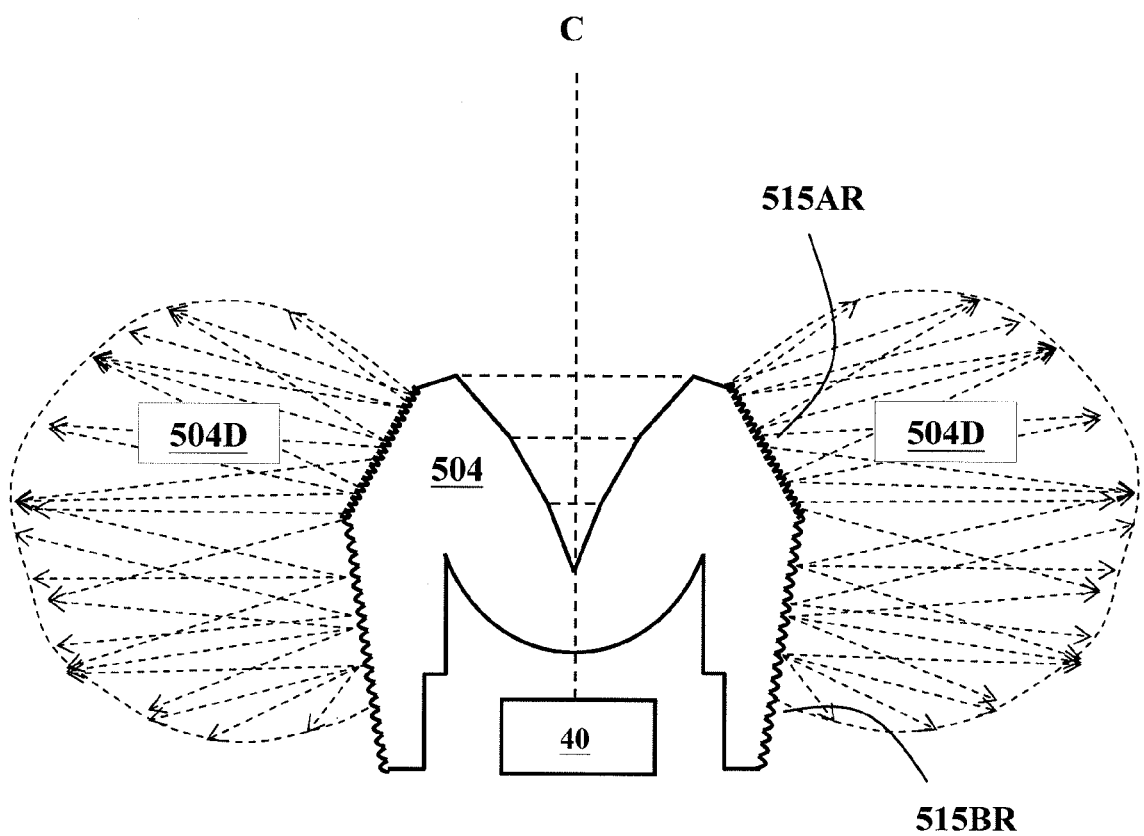

FIGS. 8-9 are a fourth lens according to the present invention.

FIG. 8 shows a section view of the fourth lens according to the present invention. The key feature of this embodiment is that the exiting surface 515AR, 515BR is roughened so that each and all exiting light beam is firstly diffused and then emitted softly and broadly. FIG. 8 shows diffused beam is exited from spots S511, S522 as an example. The LS511 shows a light intensity distribution of the light beam exits from the spot S511. The LS512 shows a light intensity distribution of the light beam exits from the spot S512. The light intensity distribution LS511, LS512 is softer as compared with the light intensity of L51, L52 of FIG. 6 respectively. The light intensity L51, L52 in FIG. 6 is a single light beam or a very narrow bunch of light beam.

FIG. 9 shows a section view of an illumination intensity profile of the lens of FIG. 8. The light beam is projected softly, evenly, and broadly to the right side and left side of the lens 504 in the section view, however the illumination intensity profile 504D is of a donut-shaped profile in a three dimensional configuration.

While several embodiments have been described by way of example, it will be apparent to those skilled in the art that various modifications may be configured without departing from the spirit of the present invention. Such modifications are all within the scope of the present invention, as defined by the appended claims.

What is claimed is:

1. A side illumination lens for a light emitting diode (LED), the lens comprising:
    a first total internal reflection surface, configured in a first angle with respect to a longitudinal axis of the lens;
    a second total internal reflection surface, neighbored to the first total internal reflection surface and configured in a second angle larger than the first angle with respect to the longitudinal axis of the lens;
    a third total internal reflection surface, neighbored to the second total internal reflection surface and configured in a third angle larger than the second angle with respect to the longitudinal axis of the lens;
    a fourth total internal reflection surface, neighbored to the third total internal reflection surface and configured in a fourth angle larger than the third angle with respect to the longitudinal axis of the lens;
    a first exiting surface, neighbored to the fourth total internal reflection surface and configured in a fifth angle larger than the fourth angle with respect to the longitudinal axis of the lens; and
    a second exiting surface, neighbored to the first exiting surface and configured in a sixth angle larger than the fifth angle with respect to the longitudinal axis of the lens.

2. A side illumination lens as claimed in claim 1, wherein the first and second exiting surfaces are roughened.

3. A side illumination lens as claimed in claim 1, further comprising:
    a recess, configured on a bottom of the lens.

4. A side illumination lens as claimed in claim 3, further comprising:
    a convex surface, configured on a top of the recess.

* * * * *